United States Patent [19]

Iwamoto

[11] Patent Number: 5,233,622
[45] Date of Patent: Aug. 3, 1993

[54] STRUCTURE OF SEMICONDUCTOR LASER PACKAGE

[75] Inventor: Koji Iwamoto, Kanagawa, Japan

[73] Assignee: Sony Corporation, Japan

[21] Appl. No.: 837,877

[22] Filed: Feb. 20, 1992

[30] Foreign Application Priority Data

Feb. 26, 1991 [JP] Japan ................................ 3-9065[U]

[51] Int. Cl.⁵ .............................................. H01S 3/04
[52] U.S. Cl. ........................................ 372/34; 372/38; 372/29
[58] Field of Search ...................... 372/36, 29, 38, 34, 372/50

[56] References Cited

U.S. PATENT DOCUMENTS 4,604,753 8/1986 Sawai ..................................... 372/38
4,803,689 2/1989 Shibanuma ........................... 372/36

Primary Examiner—Léon Scott, Jr.
Attorney, Agent, or Firm—Ronald P. Kananen

[57] ABSTRACT

A semiconductor laser package comprises a cooling structure constituted by sequentially laminating a lower substrate, a Peltier element, and an upper substrate, a heat sink having a laser element and mounted on the cooling structure, and a cap member for sealing the cooling structure and the heat sink, wherein one of the upper and lower substrate also serves as a base member of the semiconductor laser package.

8 Claims, 3 Drawing Sheets

STRUCTURE OF SEMICONDUCTOR LASER PACKAGE

BACKGROUND OF THE INVENTION

1. Field of the Invention

The present invention generally relates to semiconductor laser devices and, more particularly, is directed to the structure of a semiconductor laser package having a semiconductor laser element.

2. Description of the Prior

The semiconductor laser is required to be cooled more effectively according to the increase of the output power thereof.

As one of the methods for cooling the semiconductor laser effectively, there has been proposed to employ elements in the Peltier effect (herein after referred to as Peltier elements) which are capable of being utilized as thermoelectric cooling elements.

One example of this method will be explained with reference to FIG. 1 illustrating the cross section of the conventional semiconductor laser package. Referring to FIG. 1, Peltier elements, that is, a Peltier element group 53 is sandwiched a lower substrate 51 and an upper substrate 52 each deposited with such a conductive pattern in which one electrode of each Peltier element is connected thereto to connect, for example, adjacent Peltier elements sequentially. Thus, a cooling structure 54, that is, a thermoelectric (TE) cooler constituted by the Peltier element group 53, lower substrate 51 and upper substrate 52 which serves as a cooling electrode side or a heat absorption electrode side. A heat sink 56 provided with a semiconductor laser element 55 is mounted on the upper substrate 52. A photo detecting element such as a photo diode 57 is mounted on the upper substrate 52 such that the photo diode 57 detects the laser beam emitted from the rear side of the laser element 55 to thereby control the laser element 55 so that it is held to a predetermined operating state.

The cooling structure 54 mounted with the laser element 55 in this manner is mounted on a base member 59 of a semiconductor laser package 58, for example, a metal casing or the like such that its lower substrate 51 is jointed to the base member 59 through solder 60.

A plurality of lead wires 61 are hermetically lead out from the package 58 so as to lead out wires of the Peltier element group 53, laser element 55 and optical detection element 57 or the like. A cap member 63 having a light transmission window 62 for conducting the laser beam from the laser element 55 is attached on the top end of the package 58 to hermetically seal the cooling structure 54 within the package 58.

The package 58, if necessary, may be mounted on a cooling member having radiator fins or a water cooler or the like such that the base member 59 thereof is thermally coupled thereto so as to emit radiant energy from a heated electrode side or a heat generation side of the Peltier element group.

According to this prior-art semiconductor laser package, however, since the lower substrate 51 of the cooling structure 54, that is, the heated electrode side is soldered to the base member 59, the thermal transmission from the heated electrode side to the base member is degraded remarkably. Thus, the laser element may not be cooled sufficiently, resulting in the increase of the temperature of the laser element, which prevents the stable oscillation thereof or misleads the oscillation wavelength. Accordingly, this prior-art semiconductor laser package has the disadvantage such that, when applied to the excitation of a solid state laser such as a YAG laser, the excitation efficiency is degraded.

Further, the prior-art semiconductor laser package has the disadvantage such that, when constructing it, the soldering processing of the lower substrate 51 of the cooling member 54 and also the soldering processing of the lead wires for leading the wires out of the package 58 must be performed at the narrow area within the package 58, thereby degrading the productivity remarkably and increasing the cost.

OBJECTS AND SUMMARY OF THE INVENTION

Therefore, it is an object of the present invention to provide an improved semiconductor laser package in which the aforementioned shortcomings and disadvantages encountered with the prior art can be eliminated.

More specifically, it is an object of the present invention to provide a semiconductor laser package which is simple in construction and excellent in heat radiation efficiency, and it is easy to assemble the package to thereby improve the productivity and lower the cost thereof.

As an aspect of the present invention, a semiconductor laser package is comprised of a cooling structure constituted by sequentially laminating a lower substrate, Peltier element group, and an upper substrate, a heat sink having a laser element and mounted on the cooling structure, and a cap member for sealing the cooling structure and the heat sink, wherein one of the upper and lower substrate also serves as a base member of the semiconductor laser package.

According to the present invention, since one of the upper and lower substrates of the cooling structure, that is, a TE cooler also serves as a base member of the semiconductor laser package, it is possible to decrease the number of parts of the package and simplify the assembling process thereof, and further to prevent the degradation of the thermal conductivity due to the solder between the cooling structure and the lower substrate.

The preceding and other objects, features, and advantages of the present invention will become apparent from the following detailed description of illustrative embodiments thereof when read in conjunction with the accompanying drawings, in which like reference numerals are used to identify the same or similar parts in the several views.

DESCRIPTION OF THE PREFERRED EMBODIMENTS

A semiconductor laser package according to the first embodiment of the present invention will now be described with reference to FIGS. 2A, 2B and 3.

Figure 1:
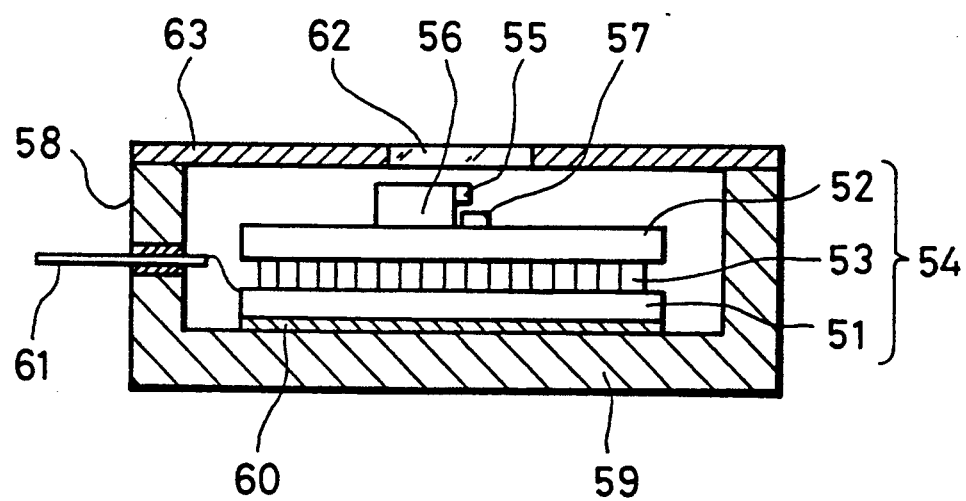
FIG. 1 is a cross sectional view of the conventional semiconductor laser package.
Figure 2A:
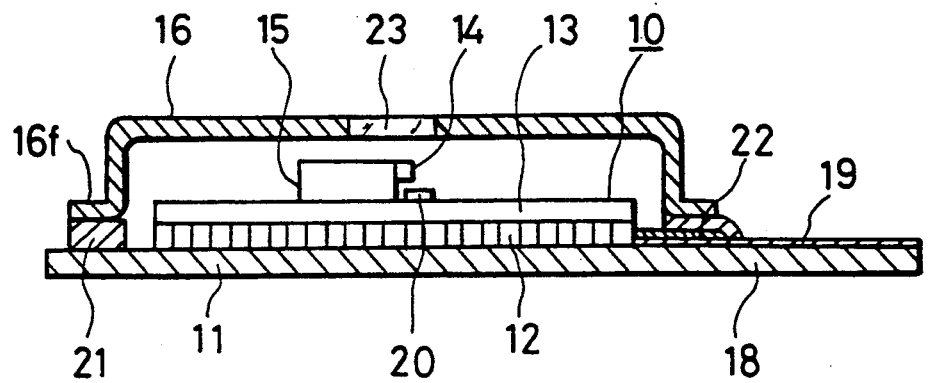
FIGS. 2A and 2B are a cross sectional view and a plan view of a semiconductor laser package according to a first embodiment of the present invention, respectively.
Figure 2B:
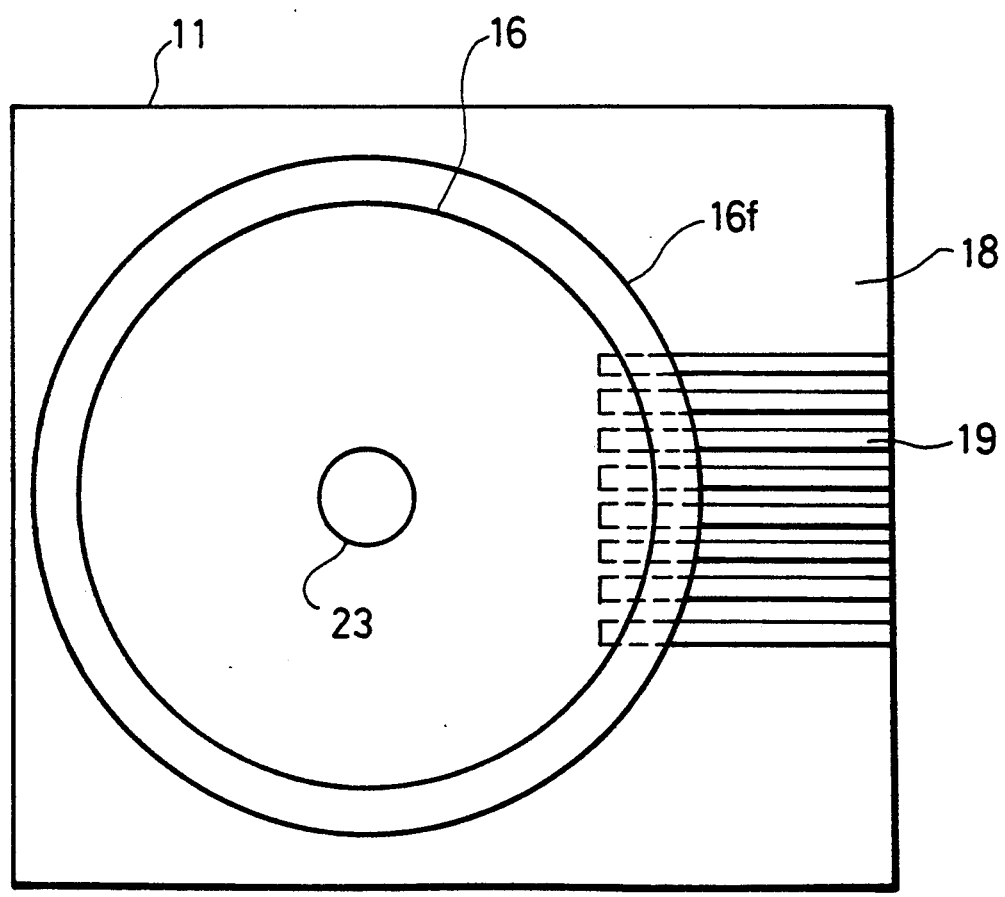

FIGS. 2A and 2B are a cross sectional view and a plan view of the first embodiment, respectively. Referring to FIGS. 2A and 2B, a Peltier element group constituted by a plurality of Peltier elements 12 each serving as a Thermoelectric (TE) element is sandwiched between an upper substrate 13 and a lower substrate 11 to thereby constitute a cooling structure 10.

Each of the Peltier elements 12 is disposed such that its cooling electrode side is opposed to the upper substrate 13 and its heated electrode side is opposed to the lower substrate 11.

Figure 3:
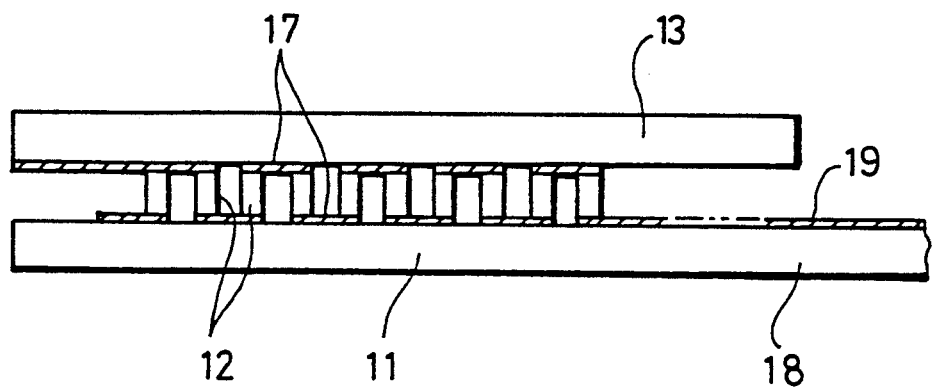
FIG. 3 is a cross sectional view of an example of the Peltier element group shown in FIG. 2A.

As shown in FIG. 3 which illustrates a cross section of one example of the cooling structure 10, on each of the opposed surfaces of the upper and lower substrates 13 and 11, there is formed a conductive layer 17 which is electrically connected to the cooling and heated side electrodes of the respective Peltier elements 12 so as to connect the respective Peltier elements 12 in a predetermined connection relation.

A terminal lead-out portion 18 is formed, for example, at one side portion of one of the substrates 11 and 13 of the cooling structure 10, ,e.g., the lower substrate 11 in the embodiment of FIG. 2 such that the portion 18 is extended to its one edge. A terminal conductive layer 19 is formed on the terminal lead-out portion 18. The terminal conductive layer 19 can be made of a copper foil pattern or the like which may be prepared, for example, by the same preparing process as the conductive layer 17 or a separate preparing process.

On the upper substrate 13, for example, there is mounted an optical detection element 20 such as a photo diode or the like which receives the laser beam emitted from a semiconductor laser element 14 and controls the operation thereof.

The laser element 14 may be formed by a semiconductor laser having a single light emission portion or a laser array having a multiplicity of light emission portions.

A cap member 16 is mounted in a sealed fashion on the lower substrate 11 of the cooling structure 10 which serves as the base member of a semiconductor laser package and in which there are located the laser element 14, the photo detecting element 20 and so on to accommodate therein the cooling structure 10, particularly, the laser element 14 and the photo detecting element 20.

The cap member 16 has a flange portion 16f protruding outwardly to form a cup-like configuration. The flange portion 16f of the cap member 16 is hermetically sealed on the lower substrate 11 through a seal member 21 of a ring-like configuration made of covar or the like by way of a welding process or through a resin seal etc.

The terminal conductive layer 19 on the terminal lead-out portion 18 is extended within the area surrounded by the cap member 16 to thereby be electrically connected to the laser element 14, photo detecting element 20, and conductive layer 17 for the Peltier elements 12 or the like by way of lead wires etc. Further, if a temperature detecting element such as a thermistor, a thermocouple or the like (not shown) is provided for controlling the cooling temperature by the Peltier elements, the temperature detecting element is also electrically connected to the terminal conductive layer 19 by lead wire etc.

The upper substrate 13 is also provided with a conductive layer (not shown) thereon for electrically connecting the respective electrodes of the photo detecting element 20 and the laser element 14 thereto by way of lead wires, for example, and further this conductive layer is connected to the corresponding terminal conductive layer 19 by lead wires or the like.

An insulating layer 22, if necessary, may be deposited on a region of the terminal conductive layer 19 where the cap member 16 is sealed to across the layer 19.

A light-transmission window 23 is formed at a portion of the cap member 16 opposed to the laser element 14 so as to conduct the laser beam emitted from the laser element 14 to the outside.

Each of the lower and upper substrates 11 and 13 may be formed by a substrate with a high thermal conductivity, e.g., a substrate made of insulation material such as $Al_2O_3$ or AlN, or a double layer substrate of a $Al_2O_3$ or AlN layer and a WSi layer.

The above-mentioned respective conductive layers are formed on the substrates 11 and 13 by way of electroless plating, electroplating, vapor deposition, and deposition of a metal foil such as a copper foil which are then subjected to a patterning processing such as photoetching or the like.

In the thus constituted laser device with a high output power, the lower surface (outer surface) of the lower substrate 11 thereof is as usual attached to a cooling member or a heat radiation member (not shown) so as to be thermally coupled thereto.

As described above, according to the semiconductor laser package of the first embodiment, the cap member 16 is mounted on the lower substrate 11 of the cooling structure 10 to close it, that is, the lower substrate 11 is also served as a base member of the semiconductor laser package.

Figure 4:
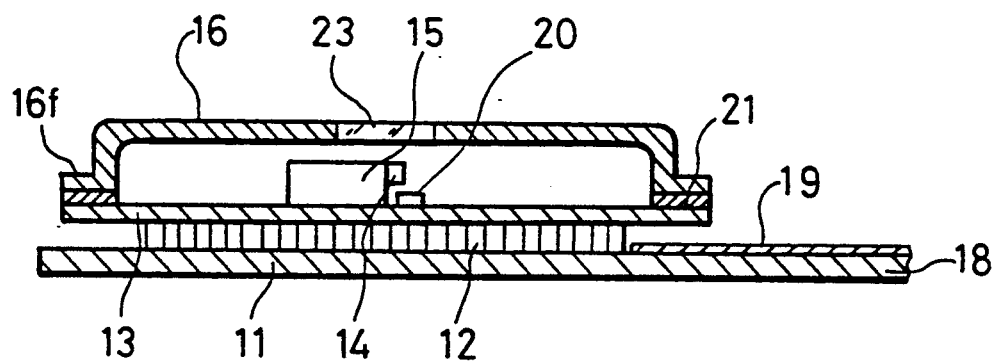
FIG. 4 is a cross sectional view of a semiconductor laser package according to a second embodiment of the present invention.

FIG. 4 shows a cross section of a semiconductor laser package according to a second embodiment of the invention. In FIG. 4, like parts corresponding to those of FIGS. 2A, 2B and 3 are marked with the same references and therefore need not be described in detail. As shown in FIG. 4, the closure of the cooling structure 10 by the cap member 16 is carried out by using the upper substrate 13 of the cooling structure 10, that is, the upper substrate 13 is also served as a base member of the semiconductor laser package.

The semiconductor laser package shown in FIG. 4 may be assembled such that the Peltier element group 12, upper substrate 13, heat sink 15 having the laser element 14, photo detecting element 20 and cap member 16 are sequentially mounted on the lower substrate 11 in this order. Alternatively, the respective elements may be sequentially mounted on both surfaces of the upper substrate 13.

As set out above, according to the present invention, since one of the upper and lower substrates 13 and 11 of the cooling structure 10, that is, the TE cooler is also served as a base member of the semiconductor laser package, the number of parts of the package can be decreased and the thermal conductivity thereof can be improved. Further, since the constructions of the package are simplified, it is possible to simplify the assembling process thereof, thereby improving the mass productivity thereof as well as decreasing the fraction defective.

Having described the preferred embodiments of the invention with reference to the accompanying drawings, it is to be understood that the invention is not limited to those precise embodiments and that various changes and modifications thereof could be effected by one skilled in the art without departing from the spirit or scope of the novel concepts of the invention as defined in the appended claims.

What is claimed is:

1. A semiconductor laser package comprising:
   a cooling structure constituted by sequentially laminating a lower substrate, a Peltier element and an upper substrate;
   a heat sink having a laser element and mounted on said cooling structure; and
   a cap member for sealing said cooling structure and said heat sink, wherein one of said upper and lower substrate also serves as a base member of said semiconductor laser package.

2. A semiconductor laser package according to claim 1, further comprising a terminal lead-out portion formed at one side portion of one of said upper and lower substrates of said cooling structure such that it is extended therefrom, and a terminal conductive layer formed on said terminal lead-out portion for electrically connecting said laser element thereto.

3. A semiconductor laser package according to claim 2, wherein said terminal conductive layer is extended within an area surrounded by said cap member to thereby be electrically connected to said laser element.

4. A semiconductor laser package as claimed in claim 1, wherein said upper substrate of said cooling structure is selected as a cooling side electrode of said Peltier element.

5. A semiconductor laser package according to claim 3, further comprising an insulating layer between said terminal conductive layer and said cap member.

6. A semiconductor laser package as claimed in claim 1, wherein said lower and upper substrates are each made of $Al_2O_3$ or AlN.

7. A semiconductor laser package as claimed in claim 1, wherein said cap member is attached to said lower substrate through a sealing member.

8. A semiconductor laser package as claimed in claim 1, wherein said cap member is attached to said upper substrate through a sealing member.

* * * * *